United States Patent
Nongaillard et al.

(10) Patent No.: US 12,538,807 B2
(45) Date of Patent: Jan. 27, 2026

(54) METHOD FOR PRODUCING AN ELECTRONIC COMPONENT ASSEMBLY ON THE FRONT FACE OF A SEMI-CONDUCTOR WAFER

(71) Applicant: STMicroelectronics France, Montrouge (FR)

(72) Inventors: Matthieu Nongaillard, Grenoble (FR); Thomas Oheix, Grenoble (FR)

(73) Assignee: STMicroelectronics France, Montrouge (FR)

( * ) Notice: Subject to any disclaimer, the term of this patent is extended or adjusted under 35 U.S.C. 154(b) by 485 days.

(21) Appl. No.: 18/247,861

(22) PCT Filed: Oct. 18, 2021

(86) PCT No.: PCT/FR2021/051806
§ 371 (c)(1),
(2) Date: Apr. 4, 2023

(87) PCT Pub. No.: WO2022/079399
PCT Pub. Date: Apr. 21, 2022

(65) Prior Publication Data
US 2023/0378085 A1    Nov. 23, 2023

(30) Foreign Application Priority Data

Oct. 16, 2020 (FR) ..................................... 2010600

(51) Int. Cl.
*H01L 23/544* (2006.01)
*G03F 1/38* (2012.01)
(Continued)

(52) U.S. Cl.
CPC .............. *H01L 23/544* (2013.01); *G03F 1/38* (2013.01); *G03F 7/70541* (2013.01);
(Continued)

(58) Field of Classification Search
CPC ........... H01L 23/544; H01L 2223/5442; H01L 2223/54433; H01L 2223/54473;
(Continued)

(56) References Cited

U.S. PATENT DOCUMENTS

| 8,187,897 B2 | 5/2012 | Cohn et al. |
| 2010/0279231 A1 | 11/2010 | Sandtner |

FOREIGN PATENT DOCUMENTS

| EP | 1427014 A2 | 6/2004 |
| JP | 2000252176 A | 9/2000 |
| WO | WO 2008069212 A1 | 6/2008 |

OTHER PUBLICATIONS

WO2008069212 with machine translation (Year: 2008).*
(Continued)

*Primary Examiner* — Britt D Hanley
*Assistant Examiner* — Victor V Barzykin
(74) *Attorney, Agent, or Firm* — Seed IP Law Group LLP

(57) ABSTRACT

The invention concerns a method of manufacturing an assembly of electronic components (3) on the front surface of a semiconductor wafer (1) comprising a plurality of field areas (4), each area (4) comprising at least one field (2) and each field (2) comprising at least one electronic component (3). The method comprises a plurality of photolithography steps to form a stack of layers forming each electronic component (3), each photolithography step comprises the application of a mask successively on each field (2) in photolithography equipment. One of the masks further comprises an identification pattern, said mask being called identification mask. At the photolithography step associated with the identification mask, as least one photolithographic parameter of the photolithography equipment is different for each field area (4), to expose the identification pattern differently in each field area (4).

12 Claims, 2 Drawing Sheets

(51) Int. Cl.
 *G03F 7/00* (2006.01)
 *H05K 1/02* (2006.01)
(52) U.S. Cl.
 CPC ...... *G03F 7/70616* (2013.01); *G03F 7/70641* (2013.01); *G03F 7/7065* (2013.01); *G03F 7/70683* (2013.01); *H05K 1/0269* (2013.01); *H01L 2223/5442* (2013.01); *H01L 2223/54433* (2013.01); *H01L 2223/54473* (2013.01); *H01L 2223/5448* (2013.01)
(58) Field of Classification Search
 CPC ............... H01L 2223/5448; G03F 1/38; G03F 7/70541; G03F 7/70616; G03F 7/70641; G03F 7/7065; G03F 7/70683; H05K 1/0269
 See application file for complete search history.

(56) References Cited

OTHER PUBLICATIONS

Dwyer et al., "Lithographic Chip Identification: Meeting the Failure Analysis Challenge," SPIE Integrated Circuit Metrology, Inspection, and Process Control VI, vol. 1673, 1992, 14 pages.

* cited by examiner

METHOD FOR PRODUCING AN ELECTRONIC COMPONENT ASSEMBLY ON THE FRONT FACE OF A SEMI-CONDUCTOR WAFER

BACKGROUND OF THE INVENTION

The present invention concerns the field of semiconductors. More precisely, the present invention bears on a method of manufacturing an assembly of electronic components on a semiconductor wafer enabling to locate all or part of these components on the wafer.

TECHNOLOGICAL BACKGROUND OF THE INVENTION

In the semiconductor industry, a usual method to manufacture a large quantity of electronic components is to elaborate an assembly of identical electronic components on a semiconductor wafer. To form on the wafer a stack of layers forming the electronic components, photolithography techniques are generally used. The principle of these techniques is well known: a layer of material is deposited over the entire wafer, after which resist is deposited on the layer. A photolithography mask is then applied above the resist, at the level of a first field called exposure field and representing a fraction of the surface area of the semiconductor wafer. In the first exposure field, the portion non-covered with the mask is then exposed to light, locally transforming the resist. The sequence of application of the photolithography mask and of exposure to light is successively repeated on each of the other exposure fields. The transformed resin is then removed, and the layer is locally etched according to the pattern of the mask, over the entire surface of the semiconductor wafer, before the remaining resist is removed in turn. The process is thus repeated for each layer in the stack, by using each time a different photolithography mask.

When the all the electronic components are formed on the wafer, the latter is cut around each component, to form a chip which is then individually encapsulated in a package. Usually, the chip pick-and-place equipment computationally ensures the matching between each chip (component) and the semiconductor wafer from which it originates.

However, in case of a failure of a component, it may be desirable to trace back the accurate location of the electronic component on the wafer, to verify the physical parameters of the layers at the manufacturing in the corresponding area of the wafer and to facilitate the failure analysis.

The traceability of the electronic component may be achieved at the time of the assembly, that is, when the component is encapsulated, with a specific mark on the package. However, this operation, often manually performed by a operator, results in significant costs and production time. Further, it is not adapted if the component is not encapsulated in a package, and is poorly adapted to mass production.

Certain assembly lines provide a semi-manual solution, with a sampling, the forming of a mapping between the position of the component on the wafer and the wafer number, as well as a serialization of the package, supervised by the operator. However, all these operations require the intervention of human operators, which may be a source of errors.

Document U.S. Pat. No. 8,187,897 discloses a method of manufacturing an assembly of electronic components on a semiconductor wafer. An individual pattern is attached to one of the layers of the electronic component, which forms a unique identifier of the component enabling to trace the wafer from which it originates as well as its position on the wafer.

However, this approach has the disadvantage of a certain complexity of implementation, particularly in that it requires the application of additional photolithography masks, with respect to a conventional method of manufacturing an assembly of components, to generate a specific pattern for each component. Such an application results in an additional cost and production time.

OBJECT OF THE INVENTION

The present invention concerns a solution alternative to those of the state of the art, and aims at overcoming all or part of the previously-mentioned disadvantages. It particularly concerns a method of manufacturing an assembly of electronic components on a semiconductor wafer enabling to locate each electronic component on the wafer after its cutting, without requiring an additional photolithography step during the elaboration of the assembly of electronic components.

BRIEF DESCRIPTION OF THE INVENTION

To achieve this goal, the object of the invention provides a method of manufacturing an assembly of electronic components on the front surface of a semiconductor wafer comprising a plurality of field areas, each area comprising at least one field and each field comprising at least one electronic component, the method comprising a plurality of photolithography steps to form a stack of layers forming each electronic component, each photolithography step comprising the application of a mask successively on each field in photolithography equipment.

The manufacturing method according to the invention is remarkable in that one of the masks in that one of the masks further comprises an identification pattern, said mask being called identification mask, and in that, at the photolithography step associated with the identification mask, as least one photolithographic parameter of the photolithography equipment is different for each field area, to expose the identification pattern differently in each field area.

Thus, at the end of the photolithography step associated with the identification mask, an identification mark specific to each field area is formed since the spatial resolution of the identification pattern from which said mark originates differs between each field area.

According to other advantageous and non-limiting features of the invention, taken alone or according to any technically feasible combination:
  the plurality of photolithography steps comprises a step of openings of contacts of the electronic components, the identification mask being the mask applied at said contact opening step;
  the photolithographic parameter is selected from among the exposure dose and the focusing;
  the exposure dose varies between 5 mJ/cm$^2$ and 1,000 mJ/cm$^2$;
  the focusing varies by +/−10 µm;
  the identification pattern has at least one dimension in the order of a few µm, typically in the range from 1 micrometer to 20 micrometers;
  the electronic components comprise high electron mobility transistors based on III-N materials;
  at least one field area comprises a plurality of fields;
  each field area comprises a plurality of fields.

The invention also concerns an electronic structure formed of an assembly of electronic components arranged on a front surface of a semiconductor wafer comprising a plurality of field areas, each area comprising at least one field and each field comprising at least one electronic component, each component being formed of a stack of layers. The electronic structure is remarkable in that the electronic components comprise an identification mark specific to each field area in that the spatial resolution the identification mark originating from the identification pattern differs between each field area.

BRIEF DESCRIPTION OF THE DRAWINGS

Other features and advantages of the invention will appear from the following detailed description in relation with the appended drawings, in which.

Figure 1:
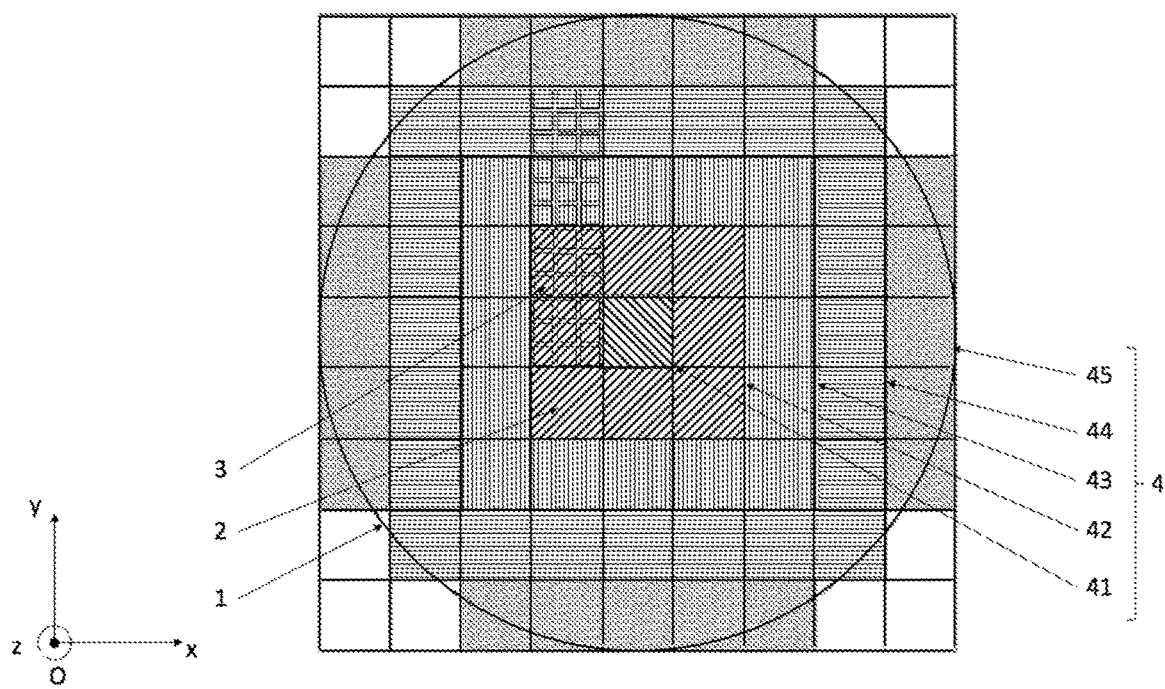
FIG. 1 shows a semiconductor wafer comprising an assembly of electronic components obtained by a manufacturing method according to the invention.

The figures are simplified representations which, for readability purposes, are not necessarily to scale. The same reference numerals in the drawings may be used for elements of same nature. The different possibilities (variants and embodiments illustrated and/or detailed in the following description) should be understood as being non-exclusive from one another and may be combined together.

DETAILED DESCRIPTION OF THE INVENTION

The invention relates to an assembly of electronic components. Electronic component designates any component of micrometer-range to millimeter-range size, formed of a stack of layers, capable of using electric currents to transmit, process, or store information. Each electronic component may thus be formed of or comprise for example a resistor, a capacitor, a coil, a transistor, an integrated circuit, any combination or any assembly of these elements, or also other elements or assemblies of elements well known by those skilled in the art.

Preferably, but without for this to be limiting for the invention, the electronic components may in particular comprise high electron mobility transistors formed on a substrate based on III-N materials.

More generally, electronic components 3 are formed on a front surface of a semiconductor wafer 1 (FIG. 1). Semiconductor wafer 1 preferably appears in the form of a circular substrate, having a diameter in the range from 100 mm to 450 mm, and having a thickness in the range from 100 to 1,500 micrometers. Semiconductor wafer 1 may be formed of any semiconductor material, for example, silicon and more specifically as previously discussed of a stack of III-N materials.

Of course, the invention is by no way limited to such shapes, dimensions, or composition of semiconductor wafer 1.

The front surface of semiconductor wafer 1 defines a (x, y) plane, the stack of layers forming the electronic components being formed along a z axis normal to this (x, y) plane. The forming of this stack requires a succession of steps, so-called manufacturing steps, i.e. steps of layer deposition, of lithography to define the structuring of said layer, of etching to structure the layer, of surface treatment, etc.

As reminded in the introductive portion of the present application, during a manufacturing lithography or photolithography step, the application of a photolithography mask and the exposure to light are performed at the level of a field 2 (also called exposure field 2). A field 2 may comprise a single electronic component or a plurality of electronic components 3, typically between two and several hundreds. For simplification in FIG. 1, components 3 have only been shown on four fields 2, in the case in point nine components 3 per field 2.

As shown in FIG. 1, the front surface of semiconductor wafer 1 comprises a plurality of field areas 4 (the example of FIG. 1 schematically shows five field areas 41, 42, 43, 44, 45). Each area 4 comprises at least one field 2, preferably a plurality of fields 2. The number and the distribution of the fields in each area 4 may be identical for all areas 4, or different from one area to the other. As will be subsequently described, the invention provides the possibility of gathering a plurality of fields 2 into field areas 4, so that the fields 2 of a same area 4 have similar characteristic, while the fields 2 of different areas 4 have different recognizable characteristics.

Thus, in the simplified example of FIG. 1, first area 41 comprises a single field 2, positioned at the center of semiconductor wafer 1. Second area 42 comprises eight fields 2, third area 43 comprises sixteen fields 2, fourth area 44 comprises twenty-four fields 2, and fifth area 45 comprises twenty fields 2. For simplification, the components 3 per field 2 have only been shown on two fields of second area 42 and on one field of the third 43 and fourth 44 areas.

The shape and the size of areas 4 may be freely chosen. Preferably, when semiconductor wafer 1 is a circular substrate, areas 4 may be chosen to be concentric, as in the example of FIG. 1. As a variant, areas 4 may represent a portion of semiconductor wafer 1, for example half or one quarter of the wafer. Areas 4 may also be sections of semiconductor wafer 1 along one or the other of the x and y axes, without for the invention to be limited in any way to such distributions of areas.

Returning to the manufacturing method according to the invention, such a method comprises a plurality of manufacturing photolithography steps to form a stack of layers forming each electronic component 3. These photolithography steps are separated by other well-known steps enabling to form the stack, such as thermal treatment, deposition, etching, cleaning, doping, or polishing steps. The different steps of forming of a stack forming an electronic component are quite conventional and known by those skilled in the art and will be only briefly discussed.

The thermal treatment steps are thus carried out in furnaces, typically at temperatures in the range from 400 to 1,200° C., to form the silicon nitride or oxide layers, or perform a rearrangement of the crystal lattices.

The deposition steps may be performed by various known physical or chemical techniques, such as vapor deposition, sputtering, or epitaxy, for example, according to the desired type of layers and to the compatibility, particularly in terms of temperature, of the stack. The deposited layers may be of various natures: semiconductor, insulating, or conductive.

During each photolithography step, semiconductor wafer 1 is arranged in photolithography equipment (not shown). After a resist layer has been deposited, generally over the entire surface of wafer 1, each photolithography step comprises the application of a mask successively on each field 2. When it is applied to a field 2, the latter is exposed to a light source of low wavelength, generally ultraviolet or X-ray, to project the image of the mask into the resist layer, forming a structure in the resist layer.

The etch steps may be carried out by means of wet etchings or dry etchings, to duplicate the structure of the resist layer in the layer of material located underneath. The structure may for example comprise an arrangement of fingers interdigited to form the gate, source, and drain electrodes of a transistor, of a network of openings to form electrically-conductive interconnection vias, or also a plurality of contact pads to connect each component 3. In all cases, the structure is here functional, that is, its shape and its layout are defined to make electronic component 3 functional.

Generally, when electronic component 3 comprises a transistor, the obtained stack comprises an active semiconductor layer, having a plurality of interconnection layers stacked thereon, and eventually an upper passivation layer.

Once all the electronic components 3 have been formed on wafer 1, the latter is cut around each component 3, forming a chip which is then individually encapsulated in a package.

In the manufacturing method according to the invention, one of the masks used during one of the manufacturing photolithography steps comprises, in addition to the so-called functional pattern(s) used to form the functional structures of the stack, an identification pattern. Since it bears this additional pattern, said mask is called "identification mask" in the present disclosure.

According to the invention, at the photolithography step associated with the identification mask, as least one photolithographic parameter of the photolithography equipment is different for each field area 4, to expose the identification pattern differently in each field area 4. In other words, at the photolithography step associated with the mask having the identification pattern, this identification mask is applied above each field 2, successively; and when the mask leaves a field area 4 to enter another one, as least one photolithographic parameter of the photolithography equipment is modified. Of course, the variation of the photolithographic parameter is controlled and its value is associated with the area 4 in question.

Thereby, the shape of the identification pattern on the resist, and of the identification mark then formed in the underlying layer, is different from one area 4 to another. Thus, after the cutting of an electronic component 3, it is possible to recognize the area 4 of wafer 1 from which the component 3 in question originates by analyzing the shape of the identification mark, which is associated with the lithographic parameter having enabled to form it and thus with the area 4 of the semiconductor wafer 1 from which it originates. The manufacturing method according to the invention thus enables, without carrying out an additional photolithography step (i.e., by performing only manufacturing photolithographic), and particularly with no additional mask to be applied, to identify the location of components 3 per area 4 of semiconductor wafer 1, by the simple controlled variation of a photolithographic parameter from one area 4 to another.

Thus, in the example shown in FIG. 1, the components 3 of the two fields of second area 42 will have an identical identification mark, but different from the components of the fields of third area 43 and of fourth area 44, themselves different from each other.

Although the shape and the dimensions of the identification pattern may be freely chosen, it is necessary to be able to identify and characterize, for each area 4, the deformation of the identification mark according to the photolithographic parameter.

Figure 2:
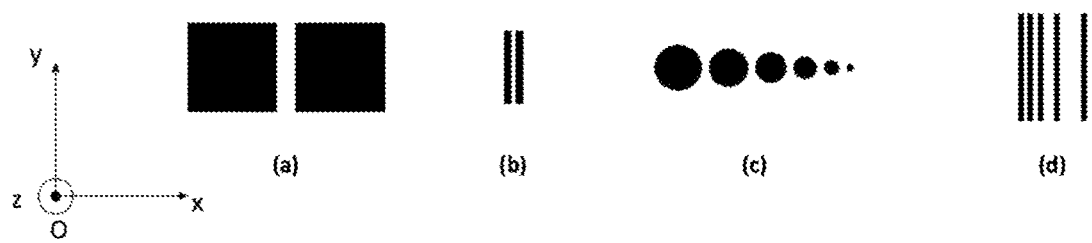
FIG. 2 shows different examples of identification patterns according to the invention.

Examples of identification patterns are shown in FIG. 2. Thus, the identification pattern may be a rectilinear opening of a given thickness drawn on the mask (FIG. 2(a)), two bars of given thickness and spacing (FIG. 2(b)), a plurality of disks of decreasing diameter aligned in a direction and spaced apart by a fixed or variable distance (FIG. 2(c)), a plurality of bars of increasing spacing in a direction (FIG. 2(d)). However, the invention is of course not limited to such examples of patterns.

The characteristics (previously-mentioned dimensions and shapes of the patterns) of the identification patterns depend on the type of resin used at the photolithography step associated with the identification mask. To be sensitive to the modifications of lithographic parameters, the identification patterns advantageously have dimensions in the order of the resist thickness.

The photolithographic parameter which varies from one area to the other is a parameter which modifies the exposure of the identification pattern from one area to the other. It may in particular be selected from among the exposure dose or the focusing. The exposure dose corresponds to the light energy received by the resin and the focusing corresponds to a sharpness adjustment. Of course, a plurality of parameters may vary, simultaneously or in alternation, and other parameters modifying the exposure can be envisaged. In all cases, the value of this or these parameter(s) will be associated with each area 4 of semiconductor wafer 1.

When the photolithographic parameter which varies is the exposure dose, the latter may typically vary between 5 mJ/cm$^2$ and 1,000 mJ/cm$^2$.

When the photolithographic parameter which varies is the focusing, the latter may typically vary by +/−10 μm.

These ranges of variation of the dose and of the focusing are sufficiently wide to envisage significant variations from field to field.

As a result, the spatial resolution of the identification pattern, from which the identification mark originates, for the components of each field area will be specific and will differ from one field area to the other.

Figure 3:
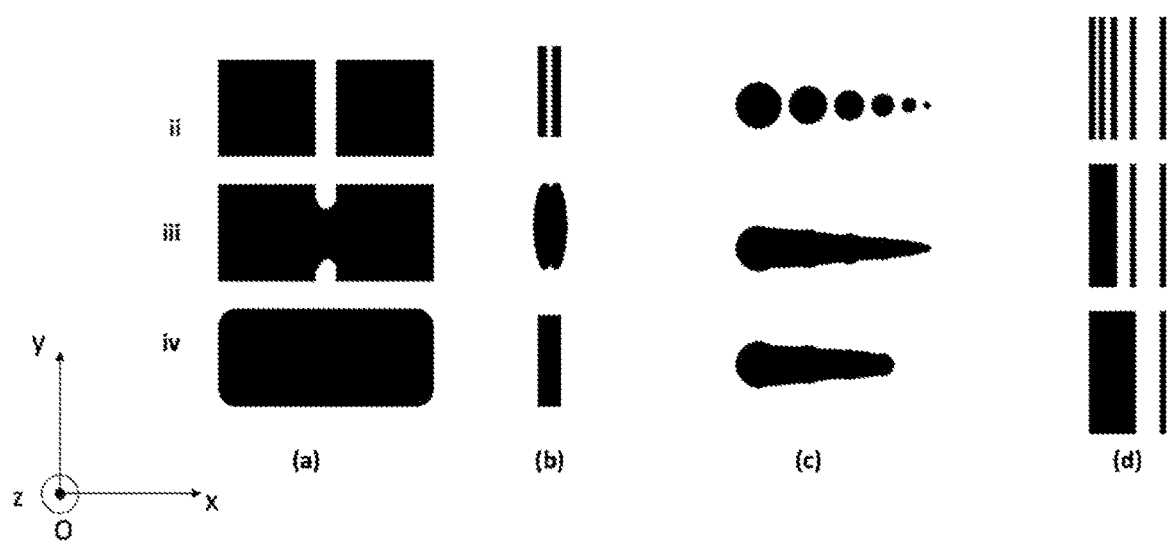
FIG. 3 shows different identification marks according to the invention obtained from different identification patterns and for different photolithographic parameters.

Examples of identification marks, formed from the identification patterns shown in FIG. 2, are shown in FIG. 3 for the three areas 42, 43, 44 (respectively designated with points ii, iii, and iv). The photolithographic parameter having varied from one area to the other here is the exposure dose, which has decreased from the second 42 to the third area 43, and then from the third 43 to the fourth area 44.

Thus, if it is started from the identification pattern of FIG. 2(a), it can be observed that the rectilinear opening, perfectly duplicated when the exposure dose is maximum (FIG. 3(a)ii), it not entirely duplicated when the exposure dose is intermediate (FIG. 3(a)iii) and is not duplicated at all any more when the exposure dose is minimum (FIG. 3(a)iv).

The maximum exposure dose may correspond to a nominal value of the exposure dose, this value being decreased for the other areas with respect to the nominal value. Of course, this situation is not limiting for the invention, and it is possible for the nominal exposure dose to correspond to the intermediate value, the exposure dose varying above or under this value according to the areas, or to the minimum value, the exposure dose increasing for the other areas with respect to the nominal value.

According to another example, when it is started from the identification pattern of FIG. 2(b), it can be observed that the two bars, perfectly duplicated when the exposure dose is maximum (FIG. 3(b)ii), are superimposed while enabling to distinguish two distinct shapes when the exposure dose is intermediate (FIG. 3(b)iii), and form a single bar when the exposure dose is minimum (FIG. 3(b)iv).

Similarly, if it is started from the identification pattern of FIG. 2(c), it can be observed that the plurality of disks is perfectly defined, each disk being perfectly distinct, when the exposure dose is maximum (FIG. 3(c)ii), that the different shapes are partially superimposed when the exposure dose is intermediate (FIG. 3(c)iii), and that the disks having the smallest diameters are no longer duplicated when the exposure dose is minimum (FIG. 3(c)iv).

According to still another example, starting from the identification pattern of FIG. 2(d), it can be observed that the plurality of bars is perfectly duplicated when the exposure dose is maximum (FIG. 2(d)ii). When the exposure dose is intermediate, the three bars having the smallest spacing are superimposed (FIG. 2(d)iii). Finally, when the exposure dose is minimum, the four bars having the smallest spacing are superimposed.

It is thus possible, by recognizing the shape of the identification mark of each of the components, to associate this shape with a given exposure dose, and more generally with a given photolithographic parameter, and thus to associate this shape with the field area 4 of the wafer 1 from which component 3 originates.

Of course, the dimension of the identification pattern has to be sufficiently small and the identification pattern has to be sufficiently distant from the functional patterns of the identification mask for the identification mark formed by the identification pattern not to affect the integrity of the functional structures of the considered layer and of the lower and upper layers.

Typically, while the surface dimensions of the functional structures of the active layer of a component in the plane formed by the front surface of semiconductor wafer 1 are in the order of from 10 nm$^2$ to 103 µm$^2$, or the dimensions of the contacts of the components at the surface of the upper passivation layer are typically in the order of 106 µm$^2$, the dimensions of the identification pattern may be in the order of 20 µm$^2$. The distance on the identification mask between a structural pattern and the identification pattern may typically be chosen to be greater than 1 µm.

As an example, a contact opening in the order of from 500 µm to 2,000 µm and identification marks in the order of from 5 to 10 µm, originating from an identification pattern present on the contact opening mask, can be mentioned.

Thus, to avoid affecting the more complex and functional layers of the stack, it is preferable for the identification mask to be a mask applied to form a layer distant from the active layer. Further, it is preferable for the layer selected to receive the identification pattern to be detectable on the electronic component after its manufacturing. Accordingly, the photolithographic step corresponding to the opening of the electric contacts of the electronic components, generally performed on the upper passivation layer, is particularly adapted to the implementation of the identification mask. The identification mark is then arranged on the upper passivation layer, which has the advantage of being visible in the context of a visual examination. An observation with an optical microscope of the bare component will then enable to identify the original location thereof on the wafer. Of course, other optical methods than the simple optical microscope observation may be used to analyze the identification marks, such as an optical analysis by means of pattern recognition software, for example.

A manufacturing method according to the invention thus enables to obtain a semiconductor wafer having an assembly of electronic components arranged on the front surface thereof. The semiconductor wafer has a plurality of field areas, each electronic component occupying a field of the front surface of the wafer, each area comprising at least one field, each electronic component being formed of a stack of layers. Each of the components comprises an identification mark originating from an identification pattern. The spatial resolution and thus the shape of these identification marks differs between each field area. Thus, this identification mark is different for each area 4, to enable, once the cutting of the electronic structure around each electronic component 3 has been performed, to be able to identify the area 4 of wafer 1 from which electronic component 3 originates.

Of course, the invention is not limited to the described embodiments and alternative embodiments may be brought thereto without departing from the framework of the invention such as defined by the claims.

The invention claimed is:

1. A method, comprising :
manufacturing an assembly of electronic components on a front surface of a semiconductor wafer, the semiconductor wafer including:
a plurality of field areas, each area including at least one field and each field comprising at least one electronic component, the manufacturing including:
forming each electronic component by forming a stack of layers by a plurality of photolithography steps, each photolithography step comprising applying a mask successively on each field with photolithography equipment;
forming in one of the masks an identification mask; and
exposing the identification mask differently in each field area by utilizing at least one different photolithographic parameter of the photolithography equipment.

2. The manufacturing method according to claim 1, comprising forming openings of contacts of the electronic components by using identification mask.

3. The manufacturing method according to claim 1, wherein the photolithographic parameter is selected from among an exposure dose and focusing.

4. The manufacturing method according to claim 3, wherein the exposure dose is between 5 mJ/cm$^2$ and 1,000 mJ/cm$^2$.

5. The manufacturing method according to claim 2, wherein the focusing varies by plus or minus 10 µm.

6. The manufacturing method according to claim 1, wherein the identification pattern has at least one dimension in the range of 1 micrometer and 20 micrometers.

7. The manufacturing method according to claim 1, wherein the electronic components comprise high electron mobility transistors based on III-N materials.

8. The manufacturing method according to claim 1, wherein each field area comprises a plurality of fields.

9. A method, comprising:
forming a plurality of high electron mobility transistors on a substrate by:
forming a plurality of field areas on the substrate, each field area includes a field, each plurality of field areas includes fields that are substantially similar to one another, each plurality of field areas includes a number of fields that is different from a number of fields in an adjacent one of the plurality of field areas, the forming including:

forming a stack of layers by performing a plurality of photolithography steps in photolithography equipment, the performing including:

forming a plurality of resist layers on the substrate;

applying a functional mask successively on each filed associated with each one of the plurality of resist layers; and applying an identification mask in at least one of the plurality of photolithography steps, during the applying a different photolithographic parameter to each field area.

10. The method of claim 9, wherein the plurality of field areas are irregularly positioned on the substrate.

11. The method of claim 10, wherein each plurality of field areas has a pattern of field areas that is different from other ones of the plurality of field areas.

12. The method of claim 10, wherein the applying the identification mask includes exposing each field area to a different pattern.

* * * * *